(12) United States Patent
Su (10) Patent No.: US 8,749,254 B2
(45) Date of Patent: Jun. 10, 2014

(54) POWER CYCLING TEST ARRANGEMENT

(75) Inventor: Michael Z. Su, Round Rock, TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 813 days.

(21) Appl. No.: 12/945,971

(22) Filed: Nov. 15, 2010

(65) Prior Publication Data

US 2012/0119767 A1 May 17, 2012

(51) Int. Cl.
*G01R 31/00* (2006.01)

(52) U.S. Cl.
USPC .................................................. 324/750.03

(58) Field of Classification Search
CPC .......... G01R 31/2884; G01R 31/3012; G01R 31/2874; G01R 31/2856; G01R 31/2817
See application file for complete search history.

(56) References Cited

U.S. PATENT DOCUMENTS 5,600,257 A * 2/1997 Leas et al. ................. 324/750.05
6,914,446 B1 * 7/2005 Tustaniwskyj et al. .. 324/750.09

* cited by examiner

*Primary Examiner* — Tung X Nguyen
(74) *Attorney, Agent, or Firm* — Harrity & Harrity, LLP (57) ABSTRACT

A device instructs a power supply to provide a current to a power cycling test structure that includes a heat source interconnected with a package, via a first level interconnect mechanism, and a printed circuit board (PCB) interconnected with the package, via a second level interconnect mechanism. The device also monitors thermal feedback associated with the heat source, and monitors, based on the provided current, voltage feedback associated with the power cycling test structure. The device further determines a thermal profile of the power cycling test structure based on the thermal feedback and the voltage feedback.

25 Claims, 10 Drawing Sheets

POWER CYCLING TEST ARRANGEMENT

BACKGROUND

Power cycling is the act of turning an electronic device (e.g., a computer or components thereof) off and then on again. An electronic device may be power cycled to reinitialize a device configuration or to recover from an unresponsive state. Electronic devices may include a number of components. For example, an electronic device, such as a computer, may include microprocessors, printed circuit boards (PCBs), sockets, chips (e.g., at a system platform level), packages, heat sink fan, dies, etc. interconnected via a variety of mechanisms (e.g., solder bumps, ball grid arrays (BGAs), pin grid arrays (PGAs), etc.) with system level mechanical retention mechanisms (e.g., die-to-socket clamping, heat sink fan to socket clamping, etc.). Such electronic components and/or interconnect mechanisms experience thermal mechanical stress under normal operating conditions, and, particularly under power cycling conditions. However, a reliable assessment of thermally-induced mechanical stress (e.g., caused by power cycling) in such electronic components and/or interconnect mechanisms is currently unavailable.

SUMMARY OF EMBODIMENTS OF THE INVENTION

According to one embodiment, a computing device-implemented method may include providing, via the computing device, a current to a power cycling test structure. The power cycling test structure may include a heat source interconnected with a package via a first level interconnect mechanism, and a printed circuit board (PCB) interconnected with the package via a second level interconnect mechanism. The method may also include monitoring, by the computing device, thermal feedback associated with the heat source, and monitoring, by the computing device, voltage feedback associated with the power cycling test structure. The method may further include determining, by the computing device, a thermal profile of the power cycling test structure based on the thermal feedback and the voltage feedback.

According to one aspect, monitoring voltage feedback may include monitoring, based on the provided current, a voltage associated with perimeter and corner bumps of a bump array, and monitoring, based on the provided current, a voltage associated with a portion of inner bumps of the bump array.

According to another aspect, the method may further include adjusting the provided current based on the determined thermal profile.

According to another embodiment, a power cycling test system may include a power cycling test structure. The power cycling test structure may include a heat source to provide thermal energy to the power cycling test structure, a package interconnected with the heat source, via a first level interconnect mechanism, and a printed circuit board (PCB) interconnected with the package, via a second level interconnect mechanism. The power cycling test system may also include a power supply to provide current to the power cycling test structure, and a computing device to determine a thermal profile of the power cycling test structure based on a thermal feedback and a voltage feedback, where the thermal feedback is associated with the heat source and is based on the provided current and the voltage feedback is associated with the power cycling test structure and is based on the provided current.

According to still another embodiment, a device may include a memory to store instructions, and a processor to execute instructions in the memory to instruct a power supply to provide a current to a power cycling test structure. The power cycling test structure may include a heat source interconnected with a package, via a first level interconnect mechanism, and a printed circuit board (PCB) interconnected with the package, via a second level interconnect mechanism. The processor may further execute instructions in the memory to monitor thermal feedback associated with the heat source, monitor, based on the provided current, voltage feedback associated with the power cycling test structure, and determine a thermal profile of the power cycling test structure based on the thermal feedback and the voltage feedback.

According to a further embodiment, a computer-readable memory device may store one or more computer-executable instructions. The computer-readable memory device may include one or more instructions to instruct a power supply to provide a current to a power cycling test structure. The power cycling test structure may include a heat source interconnected with a package, via a first level interconnect mechanism, and a printed circuit board (PCB) interconnected with the package, via a second level interconnect mechanism, The computer-readable memory device may also include one or more instructions to receive thermal feedback associated with the heat source, and receive, based on the provided current, voltage feedback associated with the power cycling test structure. The computer-readable memory device may include one or more instructions to determine a thermal profile of the power cycling test structure based on the thermal feedback and the voltage feedback, and one or more instructions to adjust the provided current when the determined thermal profile indicates that the current should be adjusted.

BRIEF DESCRIPTION OF THE DRAWINGS

The accompanying drawings, which are incorporated in and constitute a part of this specification, illustrate one or more embodiments described herein and, together with the description, explain these embodiments. In the drawings.

DETAILED DESCRIPTION

The following detailed description refers to the accompanying drawings. The same reference numbers in different drawings may identify the same or similar elements. Also, the following detailed description does not limit the invention.

Overview

Systems and/or methods described herein may provide a reliable assessment of thermally-induced mechanical stress (e.g., caused by power cycling) in components (e.g., microprocessors, PCBs, sockets, chips, packages, dies) and/or interconnect mechanisms (e.g., solder bumps, BGAs, PGAs, etc.) of a device, such as a personal computer, a laptop computer, a tablet computer, a personal digital assistant (PDA), a smart phone, a mobile phone, and/or other types computation or communication devices. In one embodiment, the systems and/or methods may connect heating elements, through a silicon back end of line (BEOL) interconnect, to a first level interconnect mechanism (e.g., a bump array, controlled collapse chip connection (C4) bumps, pillars, micro bumps, etc.). The systems and/or methods may connect a package to the heating elements via the first level interconnect mechanism, and may further connect the package to a PCB via a second level interconnect mechanism (e.g., a BGA, a PGA, pads, etc.). In one example, the systems and/or methods may daisy chain the heating elements and the package via the first level interconnect mechanism, and may daisy chain the PCB and the package via the second level interconnect.

The systems and/or methods may not only perform power cycling testing, but may also permit assessment of the reliability of all interconnect levels by using a heat source (e.g., heating elements) for power cycling and by assessing the reliability of all interconnect levels at one time. Furthermore, if a failure is detected, the systems and/or methods may utilize time domain reflectometry (TDR) to determine which interconnect level has failed.

The term "component," as used herein, is intended to be broadly construed to include hardware (e.g., a processor, a microprocessor, an application-specific integrated circuit (ASIC), a field-programmable gate array (FPGA), a chip, a memory device (e.g., a read only memory (ROM), a random access memory (RAM), etc.), etc.) or a combination of hardware and software (e.g., a processor, microprocessor, ASIC, etc. executing software contained in a memory device).

Example Power Cycling Test Arrangement

Figure 1:
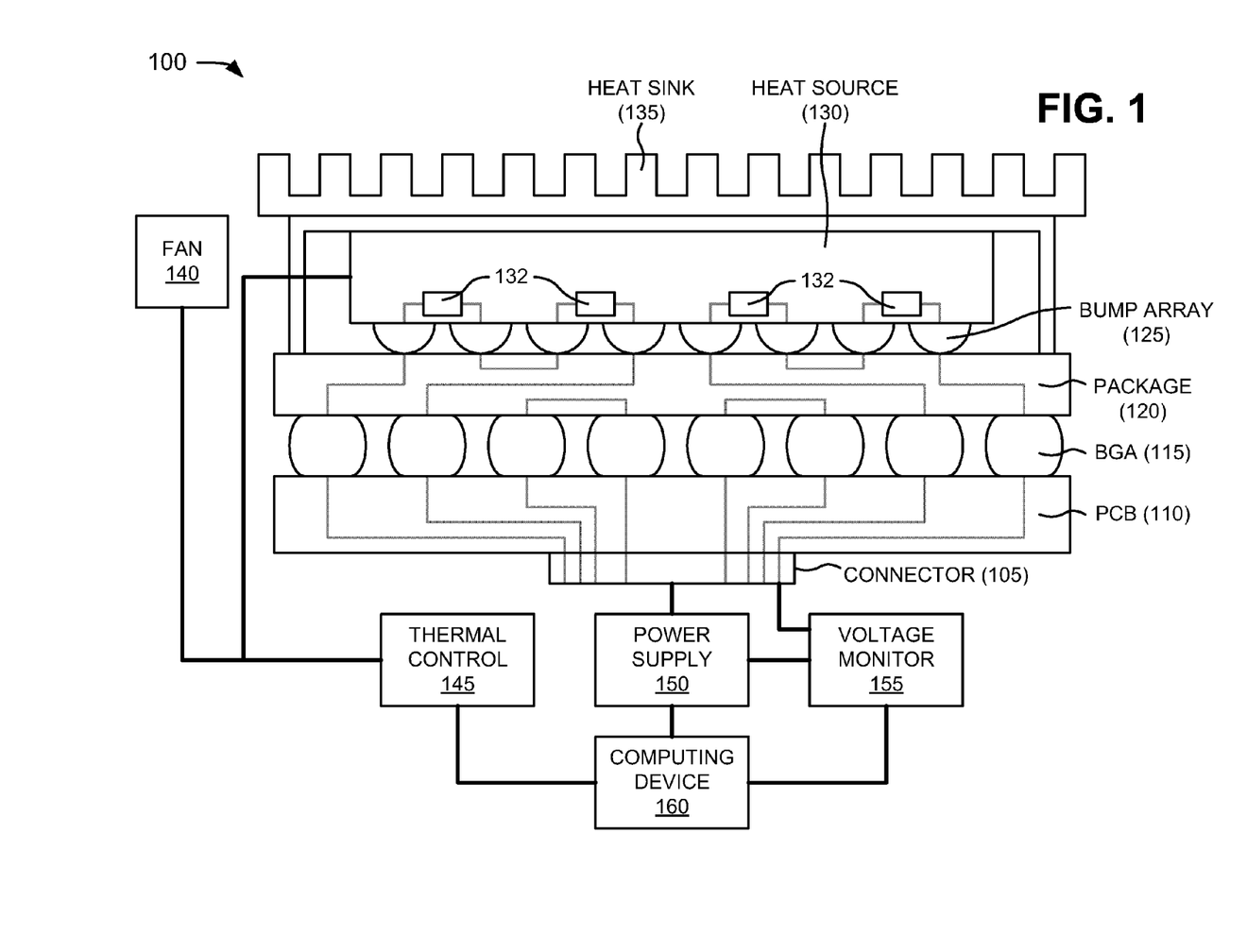
FIG. 1 is a diagram of an example power cycling test arrangement according to embodiments described herein.

FIG. 1 is a diagram of an example power cycling test arrangement 100 according to embodiments described herein. As shown, power cycling test arrangement 100 may include a connector 105, a printed circuit board (PCB) 110, a ball grid array (BGA) 115, a package 120, a bump array 125, a heat source 130 (e.g., that includes multiple heating elements 132), a heat sink 135, a fan 140, a thermal control 145, a power supply 150, a voltage monitor 155, and a computing device 160. In one embodiment, PCB 110, BGA 115, package 120, bump array 120, and heat source 130 may be representative components to be tested by arrangement 100. In other embodiments, one or more of PCB 110, BGA 115, package 120, bump array 120, and heat source 130 may be omitted, replaced with other components, or arranged differently.

Connector 105 may include a connector that enables electrical signals (e.g., current) to be provided to and/or received from wiring associated with PCB 110. For example, connector 105 may include a Universal Serial Bus (USB) connector, an eight position, eight conductors (8P8C or "RJ45") connector, a nine-pin D-shell (DE-9) connector, a power connector, etc. Connector 105 may interconnect with the wiring associated with PCB 110, and may enable current to be supplied from power supply 150 to BGA 115, via the wiring associated with PCB 110. Connector 105 may also enable voltage monitor 155 to measure voltages associated with the currents provided to and/or received from the wiring associated with PCB 110.

PCB 110 may include a mechanism to mechanically support and electrically connect electronic components using conductive wiring, pathways, or signal traces etched from copper sheets laminated onto a non-conductive substrate. PCB 110 may be a variety of sizes and shapes depending upon its use in a device, and/or the size of the device (e.g., PCB 110 may be larger in a personal computer than in a mobile phone). PCB 110 may be made from a variety of materials, including any of the materials used to make existing PCBs. The conductive wiring of PCB 110 may enable electrical signals (e.g., current) to be supplied from power supply 150 to BGA 115, and may enable current to be received from BGA 115 and provided to voltage monitor 155 so that voltage monitor 155 may measure voltage. In one example, the conductive wiring of PCB 110 may daisy chain PCB 110 and package 120 via BGA 115.

BGA 115 may include a mechanism that interconnects the wiring of PCB 110 and the wiring of package 120, and mechanically couples PCB 110 and package 120. In one embodiment, BGA 115 may include solder balls, arranged in a grid pattern, that enable electrical signals (e.g., current) to be communicated between PCB 110 and package 120. The solder balls of BGA 115 may be provided on a bottom of package 120, and the combination of BGA 115 and package 120 may be placed on PCB 110 (e.g., on pads arranged in a pattern that matches a pattern of the solder balls). The assembly may be heated, which may cause the solder balls to melt. Surface tension may cause the molten solder balls to hold package 120 in alignment with PCB 110, at a correct separation distance, while the solder balls cool and solidify. In other embodiments, BGA 115 may be replaced with other interconnect mechanisms, such as a PGA, pads, a land grid array (LGA), etc. BGA 115 may be representative of a second level interconnect mechanism provided in a device. BGA 115 may be a variety of sizes and shapes depending upon its use in the device, and/or the size of the device (e.g., BGA 115 may be larger in a personal computer than in a mobile phone). BGA 115 may be made from a variety of materials, including any of the materials used to make existing solder balls.

Package 120 may include an electronic component or a semiconductor device that is representative of a microprocessor (e.g., a central processing unit (CPU), a graphical processing unit (GPU), etc.) provided in a device. Package 120 may be a variety of sizes and shapes depending upon its use in the device, and/or the size of the device (e.g., package 120 may be smaller in a PDA than in a laptop computer). Package 120 may be made from a variety of materials, including any of the materials used to make existing microprocessors. For example in one embodiment, package 120 may include conductive wiring, pathways, or traces, which may be etched from copper sheets laminated onto a non-conductive substrate. The conductive wiring of package 120 may enable electrical signals (e.g., current) to be provided from BGA 115 to bump array 125, and may enable current to be received from bump array 125 and provided to BGA 115. In one example, the conductive wiring of package 120 may daisy chain PCB 110 and package 120 via BGA 115, and may daisy chain package 120 and heat source 130 via bump array 125.

Bump array 125 may include a mechanism that interconnects the wiring of package 120 and the wiring of heating elements 132 of heat source 130, and mechanically couples package 120 and heat source 130. In one embodiment, bump array 125 may include solder bumps (e.g., C4 bumps), arranged in a pattern, that enable electrical signals (e.g., current) to be communicated between package 120 and heat source 130. The solder bumps of bump array 125 may be provided on a bottom of heat source 130, and the combination of bump array 125 and heat source 130 may be placed on package 120 (e.g., on pads arranged in a pattern that matches a pattern of the solder bumps). The assembly may be heated, which may cause the solder bumps to melt. Surface tension may cause the molten solder bumps to hold heat source 130 in alignment with package 120, at a correct separation distance, while the solder bumps cool and solidify. The solder bumps may serve various functions. For example, the solder bumps may provide an electrical connection between package 120 and heat source 130, may provide thermal conduction from heat source 130 to package 120, may act as spacer for preventing electrical shorts between package 120 and heat source 130, and may provide mechanical support to heat source 130.

In other embodiments, bump array 125 may be replaced with other interconnect mechanisms, such as solder pillars, micro bumps, etc. Bump array 125 may be representative of a first level interconnect mechanism provided in a device. Bump array 125 may be a variety of sizes and shapes depending upon its use in the device, and/or the size of the device (e.g., bump array 125 may smaller in a mobile phone than in a personal computer). Bump array 125 may be made from a variety of materials, including any of the materials used to make existing solder bumps.

In one example embodiment, perimeter and corner solder bumps of bump array 125 may be fully monitored by arrangement 100. Inner solder bumps of bump array 125 may be sampled by arrangement 100 since inner solder bumps of bump array 125 may not be prone to failures. The solder bumps of bump array 125 may be daisy chained together via the wiring provided in package 120 and the wiring provided in heat source 130.

Heat source 130 may include may include an electronic component or a semiconductor device that is representative of a semiconductor die provided in a device. Heat source 130 may be a variety of sizes and shapes depending upon its use in the device, and/or the size of the device (e.g., heat source 130 may be larger in a laptop computer than in a mobile phone). Heat source 130 may be made from a variety of materials, including any of the materials (e.g., silicon) used to make existing semiconductor dies. For example in one embodiment, heat source may include conductive wiring, pathways, or traces that interconnect heating elements 132 and bump array 125. The conductive wiring of heat source 130 may enable electrical signals (e.g., current) to be provided from bump array 125 to heating elements 132 so that heating elements 132 may generate heat for heat source 130. The conductive wiring off heat source 130 may enable current to be provided from heat source 130 to package 120 via bump array 125.

In one example embodiment, heat source 130 (e.g., via heating elements 132) may be used to simulate power cycling (e.g., and any thermally-induced mechanical stress caused by power cycling) in arrangement 100. Heat source 130 may provide a controllable maximum power and ramp rate for the simulated power cycling. Heat source 130 may be passively cooled (e.g., via heat sink 135) or actively cooled (e.g., via fan 140 or via reducing the current supplied to heating elements 132). Heat source 130 may also include multi-location thermal diodes and/or thermal resistors (not shown) that monitor thermal conditions of locations of heat source 130. The monitored thermal conditions may be used to control the heat generated by heat source 130, as described below in connection with FIGS. 3 and 6.

Heat sink 135 may include a component or an object that transfers thermal energy (or heat) from a higher temperature object (e.g., heat source 130) to a lower temperature fluid medium (e.g., air). As shown in FIG. 1, heat sink 135 may contact (or connect with) heat source 130, and may include extended surfaces (or fins) to increase the surface area in contact with the cooling fluid (e.g., air). Heat sink 135 may enable heat source 130 to be passively cooled.

Fan 140 may include a device that uses an electric motor to rotate vanes in order to move air. In one embodiment, fan 140 may provide air (or a current of air) to heat sink 135 in order to actively cool heat sink 135.

Thermal control 145 may include one or more computation or communication devices, that gather, process, and/or provide information in a manner described herein. Thermal control 145 may be coupled to heat source 130 (e.g., via a wired connection), and may be coupled to fan 140 (e.g., via a wired or wireless connection). In one embodiment, thermal control 145 may include a device that receives thermal feedback from heat source 130 (e.g., from the multi-location thermal diodes and/or thermal resistors), and provides the thermal feedback to computing device 160. Thermal control 145 may receive a thermal control signal from computing device 160 (e.g., based on the thermal feedback and/or a desired thermal profile to be generated by arrangement 100), and may control fan 140 based on the thermal control signal. For example, if the heat generated by heat source 130 needs to be reduced, thermal control 145 may instruct fan 140 to increase its speed so that heat source 130 may be cooled more rapidly.

Power supply 150 may be coupled to PCB 110 (e.g., via connector 105), and may include a device that supplies electrical energy (e.g., current) to PCB 110 via connector 105. In one example embodiment, power supply 150 may provide current to connector 105, and the current may be provided to heat source 130 (e.g., so that heat source 130 creates a thermal profile in arrangement 100). Computing device 160 may receive voltage feedback (e.g., from voltage monitor 155) and may generate a power signal based on the voltage feedback. The power signal may be provided to power supply 150, and power supply 150 may adjust (if necessary) the current supplied to connector 105 based on the power signal.

Voltage monitor 155 may be coupled to PCB 110 (e.g., via connector 105), may be coupled to power supply 150 (e.g., via a wired or wireless connection), and may include a device that monitors an output voltage (e.g., voltage feedback) of power supply 150. In one embodiment, voltage monitor 155 may compare a current provided to connector 105 (e.g., by power supply 150) and a current received from connector 105 in order calculate the output voltage of power supply 150. Voltage monitor 155 may provide the voltage feedback to computing device 160, and computing device 160 may provide a power signal to power supply 150.

Computing device 160 may include one or more computation or communication devices, that gather, process, and/or provide information in a manner described herein. For example, computing device 160 may include a personal computer, a desktop computer, a laptop computer, a tablet computer, a server device, and/or another type of computation or communication device. Computing device 160 may be coupled to thermal control 145, power supply 150, and voltage monitor 155 (e.g., via wired or wireless connections). In one embodiment, computing device 160 may monitor the current provided by power supply 150 to connector 105, and may receive voltage feedback from voltage monitor 155.

Computing device 160 may receive thermal feedback from thermal control 145, and may calculate a power cycling thermal profile based on the thermal feedback and/or the voltage feedback. If the power cycling thermal profile needs to be adjusted, computing device 160 may provide a power signal (e.g., to power supply 150) that indicates an adjustment is needed for the current supplied by power supply 150, and may provide a thermal control signal (e.g., to thermal control 145) that indicates an adjustment is needed for the heat provided by heat source 130.

Although FIG. 1 shows example components of power cycling test arrangement 100, in other embodiments, power cycling test arrangement 100 may include fewer components, different components, differently arranged components, or additional components than depicted in FIG. 1. Alternatively, or additionally, one or more components of power cycling test arrangement 100 may perform one or more other tasks described as being performed by one or more other components of power cycling test arrangement 100.

Example Thermal Control/Computing Device Configuration

Figure 2:
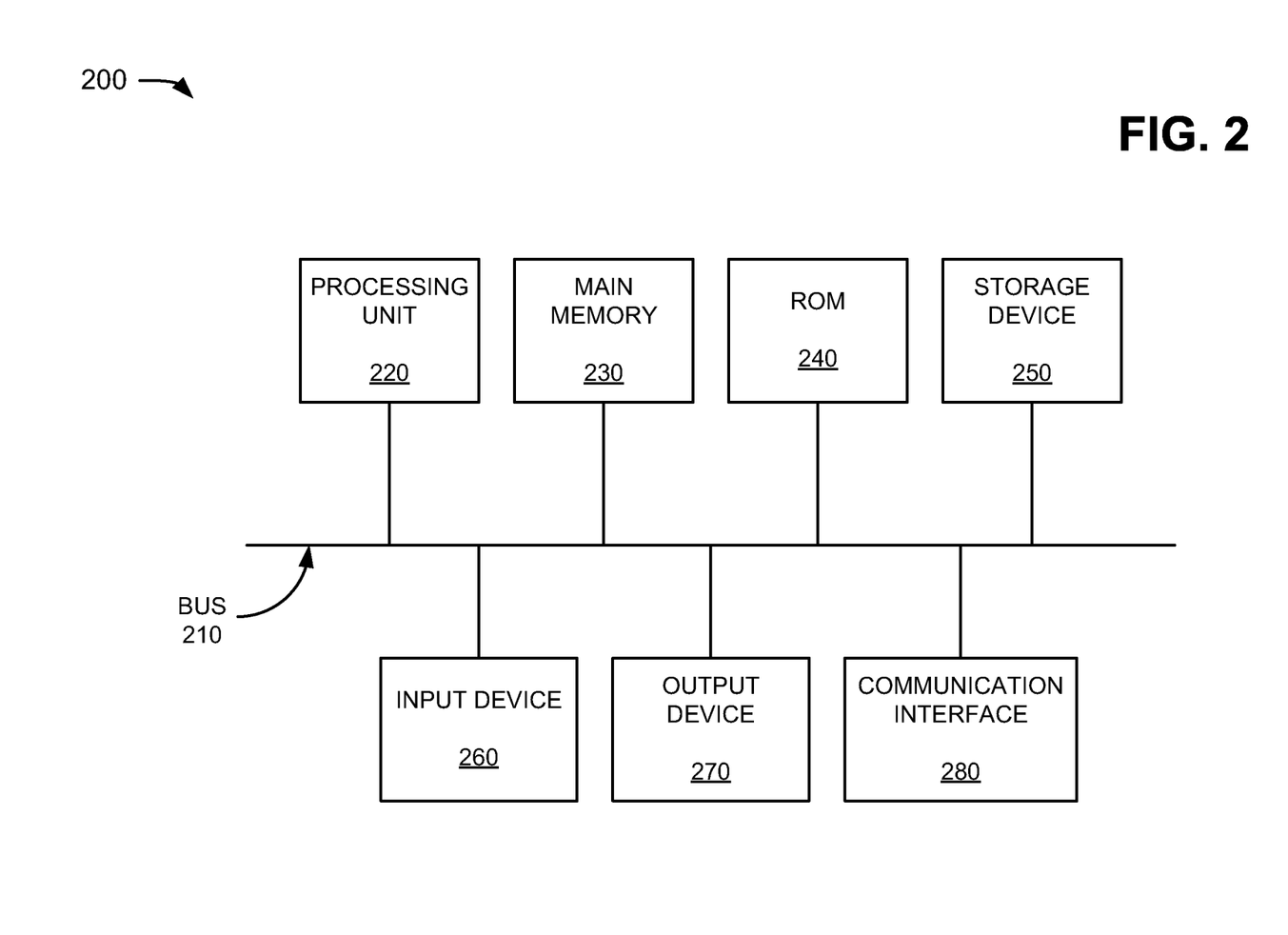
FIG. 2 is a diagram of example components of a device that may correspond to a thermal control and/or a computing device of the power cycling test arrangement depicted in FIG. 1.

FIG. 2 is a diagram of example components of a device 200 that may correspond to a thermal control 145 and/or computing device 160. As illustrated in FIG. 2, device 200 may include a bus 210, a processing unit 220, a main memory 230, a ROM 240, a storage device 250, an input device 260, an output device 270, and/or a communication interface 280. Bus 210 may include a path that permits communication among the components of device 200.

Processing unit 220 may include one or more processors, microprocessors, or other types of processing units that may interpret and execute instructions. Main memory 230 may include a RAM, a dynamic RAM (DRAM), and/or another type of dynamic storage device that may store information and instructions for execution by processing unit 220. ROM 240 may include a ROM device or another type of static storage device that may store static information and/or instructions for use by processing unit 220. Storage device 250 may include a magnetic and/or optical recording medium and its corresponding drive.

Input device 260 may include a mechanism that permits an operator to input information to device 200, such as a keyboard, a mouse, a pen, a microphone, voice recognition and/or biometric mechanisms, a touch screen, etc. Output device 270 may include a mechanism that outputs information to the operator, including a display, a printer, a speaker, etc. Communication interface 280 may include any transceiver-like mechanism that enables device 200 to communicate with other devices and/or systems. For example, communication interface 280 may include mechanisms for communicating with another device or system via a network.

As described herein, device 200 may perform certain operations in response to processing unit 220 executing software instructions contained in a computer-readable medium, such as main memory 230. A computer-readable medium may be defined as a physical or logical memory device. A logical memory device may include memory space within a single physical memory device or spread across multiple physical memory devices. The software instructions may be read into main memory 230 from another computer-readable medium, such as storage device 250, or from another device via communication interface 280. The software instructions contained in main memory 230 may cause processing unit 220 to perform processes described herein. Alternatively, hardwired circuitry may be used in place of or in combination with software instructions to implement processes described herein. Thus, embodiments described herein are not limited to any specific combination of hardware circuitry and software.

Although FIG. 2 shows example components of device 200, in other embodiments, device 200 may include fewer components, different components, differently arranged components, or additional components than depicted in FIG. 2. Alternatively, or additionally, one or more components of device 200 may perform one or more other tasks described as being performed by one or more other components of device 200.

Example Signaling of Power Cycling Test Arrangement

Figure 3:
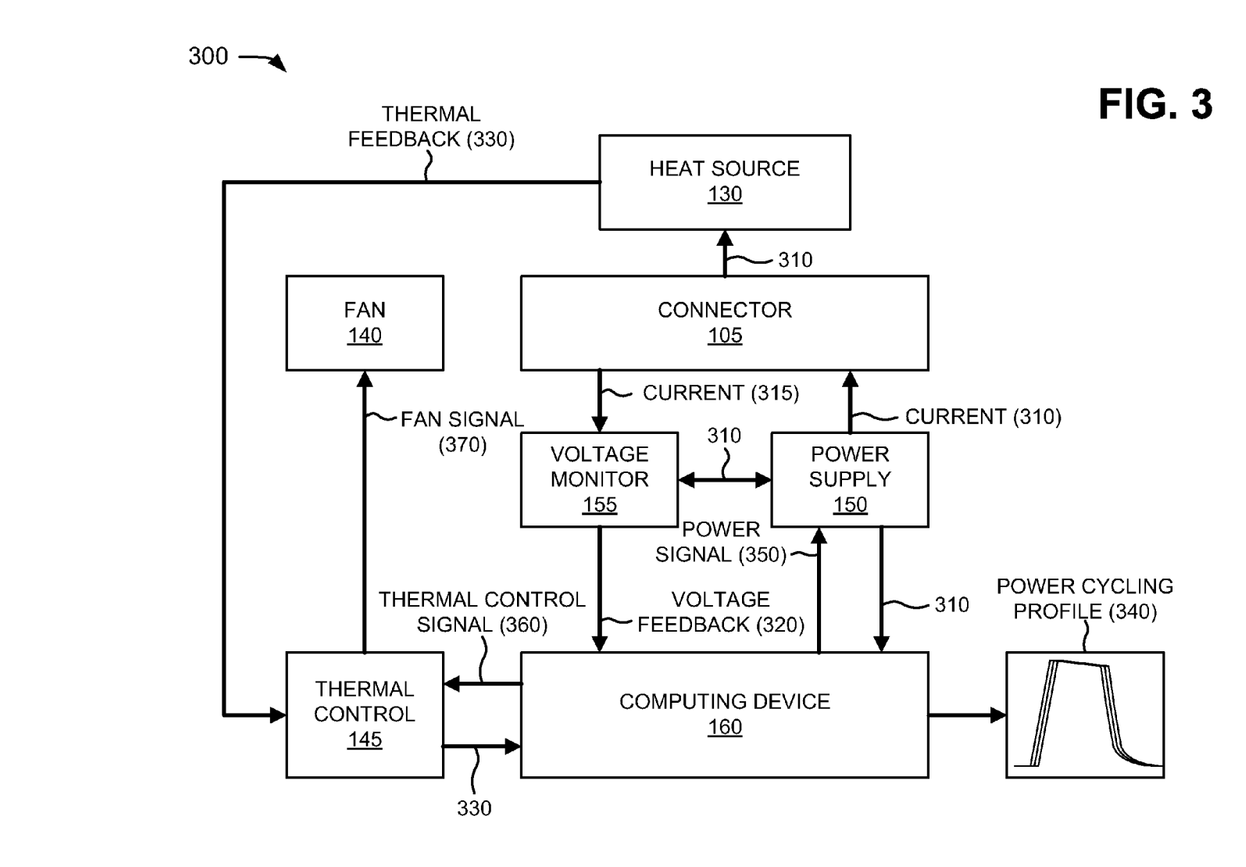
FIG. 3 is a diagram of an example portion of the power cycling test arrangement depicted in FIG. 1.

FIG. 3 is a diagram of an example portion 300 of power cycling test arrangement 100. As illustrated, example arrangement portion 300 may include connector 105, heat source 130, fan 140, thermal control 145, power supply 150, voltage monitor 155, and computing device 160. Connector 105, heat source 130, fan 140, thermal control 145, power supply 150, voltage monitor 155, and computing device 160 may include the features described above in connection with, for example, one or more of FIGS. 1 and 2.

As further shown in FIG. 3, power supply 150 may provide current 310 to connector 105, and connector 105 may provide (e.g., via PCB 110, BGA 115, package 120, and bump array 125 (not shown)) current 310 to heat source 130. In one embodiment, power supply 150 may generate current 310 based on instructions, received from computing device 160, to generate current 310. Heat source 130 may provide current 310 to heating elements 132 (not shown), and heating elements 132 may generate thermal energy (e.g., heat) based on the provided current 310. As further shown in FIG. 3, voltage monitor 155 may receive current 315 from connector 105, and may compare current 310 to current 315 in order to calculate voltage feedback 320. Voltage feedback 320 may include an output voltage associated with power supply 150. Voltage monitor 155 may provide voltage feedback 320 to computing device 160.

Heat source 130 may provide thermal feedback 330 to thermal control 145. Thermal feedback 330 may include an amount of thermal energy (e.g., heat) generated by heat source 130 based on the supplied current 310. Thermal control 145 may provide thermal feedback 330 to computing device 160. Computing device 160 may receive voltage feedback 320 and thermal feedback 330, and may calculate a power cycling thermal profile 340 based on voltage feedback 320 and/or thermal feedback 330. Power cycling thermal profile 340 may include a graph depicting a temperature profile of heat source 130 over time. Power cycling thermal profile 340 may provide a visual indication of thermal mechanical stress induced in arrangement 100 (e.g., in PCB 110, BGA 115, package 120, and/or bump array 125). If a failure is detected in arrangement 100 based on power cycling thermal profile 340, computing device 160 may utilize time domain reflectometry (TDR) to determine which level of interconnect (e.g., bump array 125 or BGA 115) has failed. TDR is a measurement technique used to determine characteristics of electrical connections by observing reflected waveforms.

If power cycling thermal profile 340 needs to be adjusted, computing device 160 may provide a power signal 350 to power supply 150. Power signal 350 may indicate that an adjustment is needed for current 310 supplied by power supply 150. Power supply 150 may adjust current 310 according to power signal 350. Alternatively, or additionally, computing device 160 may provide a thermal control signal 360 to thermal control 145. Thermal control signal 360 may indicate that an adjustment is needed for the thermal energy provided by heat source 130. Based on thermal control signal 360, thermal control 145 may instruct (e.g., via a fan signal 370) fan 140 to either increase its speed (e.g., to provide more cooling) or to decrease its speed (e.g., to provide less cooling).

Although FIG. 3 shows example components of arrangement portion 300, in other embodiments, arrangement portion 300 may contain fewer components, different components, differently arranged components, and/or additional components than depicted in FIG. 3. Alternatively, or additionally, one or more components of arrangement portion 300 may perform one or more other tasks described as being performed by one or more other components of arrangement portion 300.

Example Ball Grid Array/Package Configuration

Figure 4:
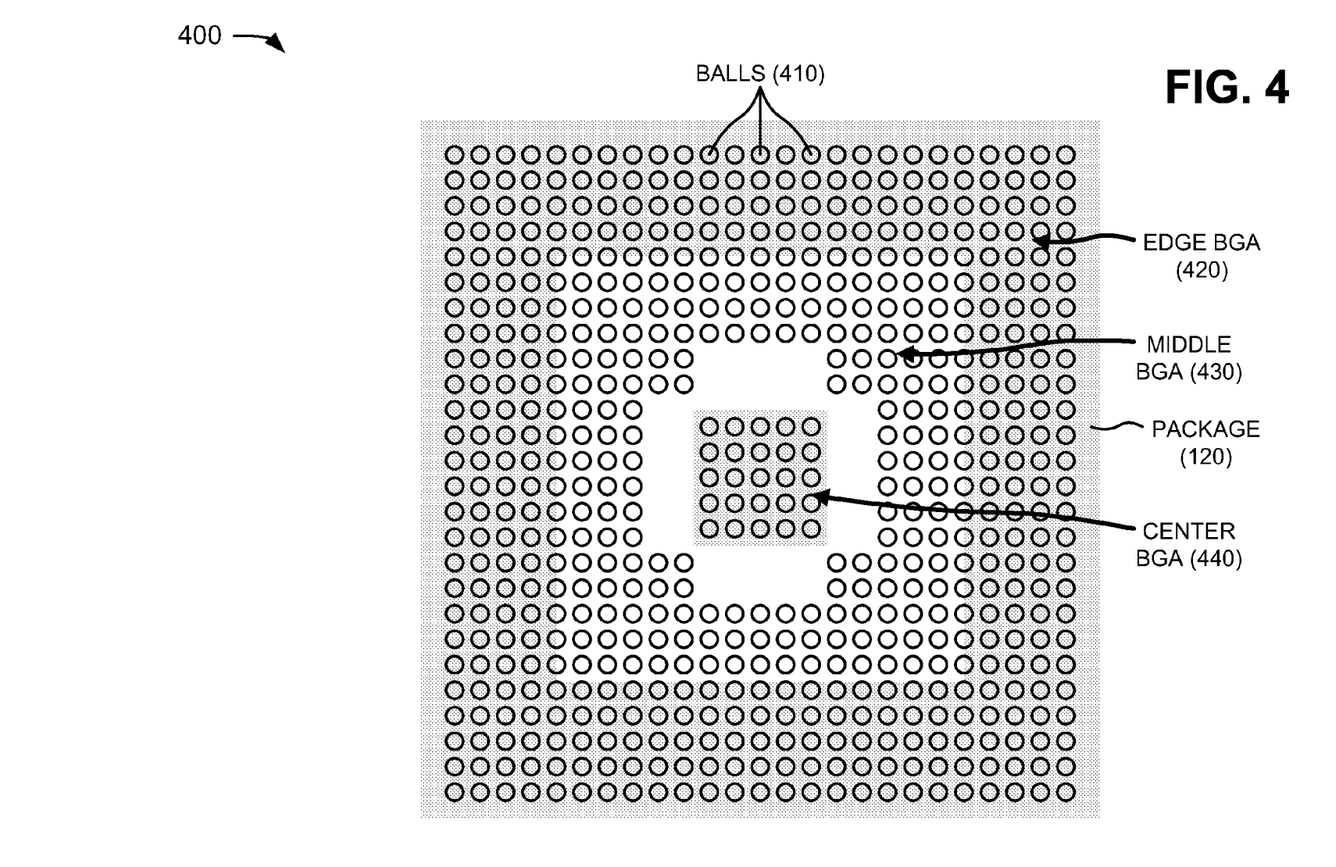
FIG. 4 is a diagram of example components of a ball grid array and a package of the power cycling test arrangement depicted in FIG. 1.

FIG. 4 is a diagram 400 of example components of BGA 115 and package 120 of power cycling test arrangement 100. In one embodiment, diagram 400 may depict a bottom up view of BGA 115 and package 120. BGA 115 and package 120 may include the features described above in connection with, for example, FIG. 1.

As shown in FIG. 4, BGA 115 may include multiple solder balls 410 (e.g., arranged in a grid pattern on package 120) that enable electrical signals (e.g., current) to be communicated between PCB 110 and package 120. Solder balls 410 of BGA 115 may be provided on a bottom portion of package 120, and on a top portion of PCB 110 (not shown). In one example, each of solder balls 410 may include a fusible metal alloy with a melting point (or melting range) of 90° C. to 450° C. (190° F. to 840° F.). Solder balls 410 may be a variety of sizes and shapes depending upon the size of PCB 110 and/or package 120.

As further shown in FIG. 4, BGA 115 may include an edge BGA 420, a middle BGA 430, and a center BGA 440. Edge BGA 420 may include an arrangement of solder balls 410 provided near edge surface portions (including corners) of package 120. Middle BGA 430 may include an arrangement of solder balls 410 provided near a middle surface portion of package 120 (e.g., inside of edge BGA 420 and outside of center BGA 440). Center BGA 440 may include an arrangement of solder balls 410 provided at a center surface portion of package 120. In one embodiment, edge BGA 420 and center BGA 440 may be daisy chained together via PCB 110.

Although FIG. 4 shows example components of BGA 115 and package 120, in other embodiments, BGA 115 and package 120 may include fewer components, different components, differently arranged components, or additional components than depicted in FIG. 4. Alternatively, or additionally, one or more components of BGA 115 and package 120 may perform one or more other tasks described as being performed by one or more other components of BGA 115 and package 120.

Example Bump Array/Heat Source Configuration

Figure 5:
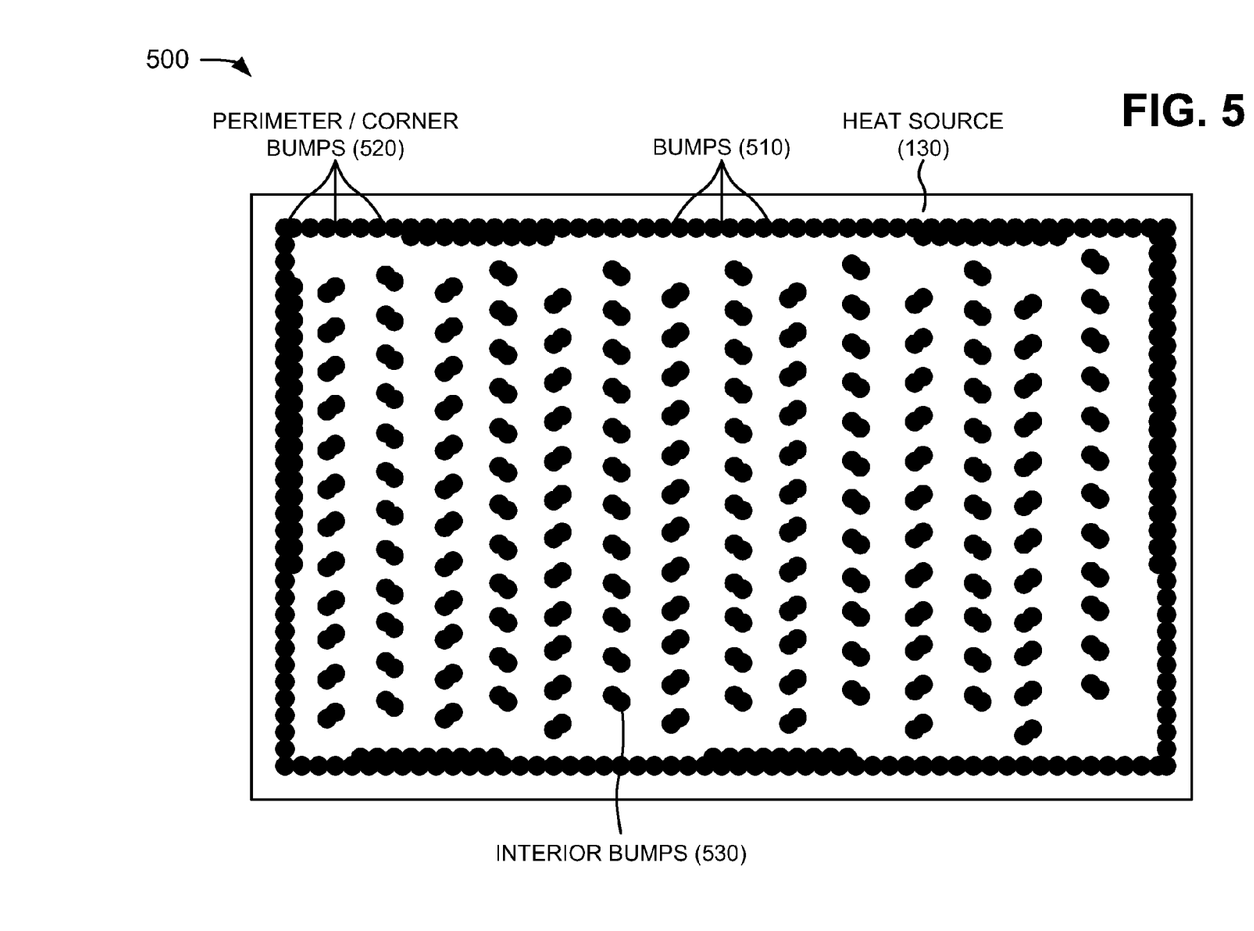
FIG. 5 is a diagram of example components of a bump array and a heat source of the power cycling test arrangement depicted in FIG. 1.

FIG. 5 is a diagram 500 of example components of bump array 125 and heat source 130 of power cycling test arrangement 100. In one embodiment, diagram 500 may depict a bottom up view of bump array 125 and heat source 130. Bump array 125 and heat source 130 may include the features described above in connection with, for example, one or more of FIGS. 1 and 3.

As shown in FIG. 5, bump array 125 may include multiple solder bumps 510 (e.g., arranged in a pattern on heat source 130) that enable electrical signals (e.g., current) and thermal energy (e.g., heat) to be communicated between package 120 and heat source 130. Solder bumps 510 of bump array 125 may be provided on a bottom portion of heat source 130, and on a top portion of package 120 (not shown). In one example, each of solder bumps 510 may include a fusible metal alloy with a melting point (or melting range) of 90° C. to 450° C. (190° F. to 840° F.). Solder bumps 510 may be a variety of sizes and shapes depending upon the size of package 120 and/or heat source 130.

As further shown in FIG. 5, bump array 125 may include perimeter and corner bumps 520 and interior bumps 530. Perimeter/corner bumps 520 may include an arrangement of solder bumps 510 provided near perimeter surface portions and corners of heat source 130. Interior bumps 530 may include an arrangement of solder bumps 510 provided near an interior surface portion of heat source 130 (e.g., inside of perimeter/corner bumps 520). In one embodiment, voltages associated with perimeter/corner bumps 520 may be fully monitored by arrangement 100, and voltages associated with a portion of inner bumps 530 may be monitored by arrangement 100 since inner bumps 630 may not be prone to failures. Alternatively, inner bumps 530 may be daisy chained together so that voltages associated with inner bumps 630 are fully monitored by arrangement 100.

Although FIG. 5 shows example components of bump array 125 and heat source 130, in other embodiments, bump array 125 and heat source 130 may include fewer components, different components, differently arranged components, or additional components than depicted in FIG. 5. Alternatively, or additionally, one or more components of bump array 125 and heat source 130 may perform one or more other tasks described as being performed by one or more other components of bump array 125 and heat source 130.

Example Heat Source Configuration

Figure 6:
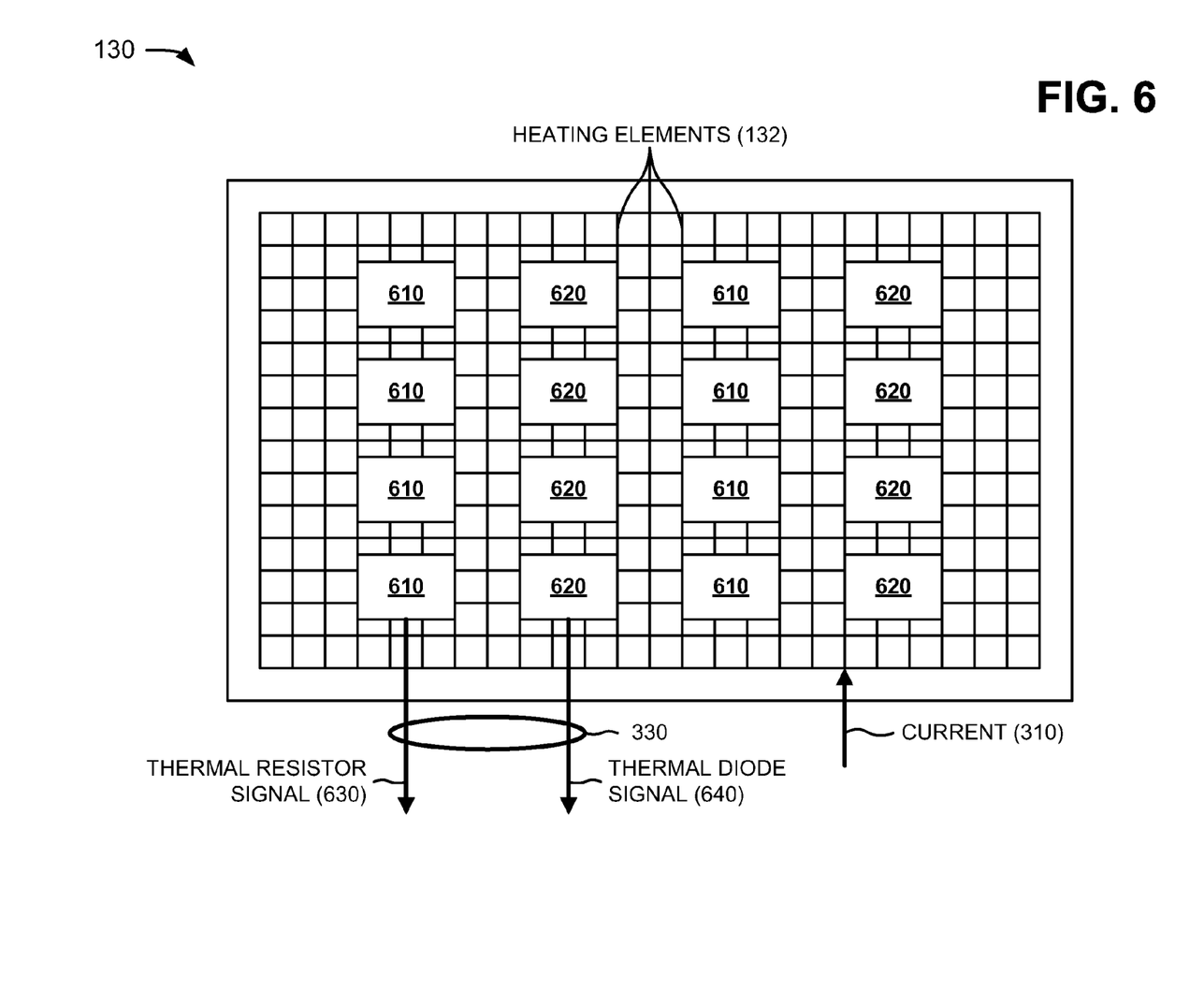
FIG. 6 is a diagram of example components of the heat source of the power cycling test arrangement depicted in FIG. 1.

FIG. 6 is a diagram of example components of heat source 130 of power cycling test arrangement 100. As shown, heat source 130 may include heating elements 132, multi-location thermal resistors 610, and multi-location thermal diodes 620. Heating elements 132 may include the features described above in connection with, for example, one or more of FIGS. 1 and 3.

In one embodiment, heating elements 132 may include metal (e.g., copper) heaters arranged in a grid through heat source 130. Heating elements 132 may be used to simulate power cycling (e.g., and any thermally-induced mechanical stress caused by power cycling) in arrangement 100. Heating elements 132 may provide a controllable maximum power and ramp rate for the simulated power cycling. As shown in FIG. 6, heating elements 132 may receive current 310, and current 310 may cause heating elements 132 to generate thermal energy (e.g., heat).

Each of thermal resistors 610 may include a sensor device (e.g., a semiconductor resistor) that may significantly change its electrical resistance based upon a change in temperature. Thermal resistor 610 may include an operating temperature range and a temperature coefficient of resistance (e.g., a relative percentage increase in resistance based upon a temperature change of 1° K.). In one example, thermal resistor 610 may use voltage and current to calculate the resistance since the resistance is proportional to the temperature and can be controlled. As shown in FIG. 6, each of thermal resistors 610 may monitor a temperature change at a location of heat source 130, and may output the monitored temperature change as a thermal resistor signal 630.

Each of thermal diodes 620 may include a sensor device (e.g., a semiconductor diode) that monitors a temperature of an adjacent device. As shown in FIG. 6, each of thermal diodes 620 may monitor a temperature at a location of heat source 130, and may output the monitored temperature as a thermal diode signal 640. As further shown in FIG. 6, thermal resistor signal 630 and thermal diode signal 640 may correspond to thermal feedback 330 (FIG. 3) provided to thermal control 145. In one embodiment, one or more thermal resistors 610 may be replaced with one or more thermal diodes 620, or one or more thermal diodes 620 may be replaced with one or more thermal resistors 610. In another embodiment, one or more thermal resistors 610 and/or thermal diodes 620 may be located at corners, perimeters, the center, or all over heat source 130.

Although FIG. 6 shows example components of heat source 130, in other embodiments, heat source 130 may include fewer components, different components, differently arranged components, or additional components than depicted in FIG. 6. Alternatively, or additionally, one or more components of heat source 130 may perform one or more other tasks described as being performed by one or more other components of heat source 130.

Example Power Cycling Thermal Profile

Figure 7:
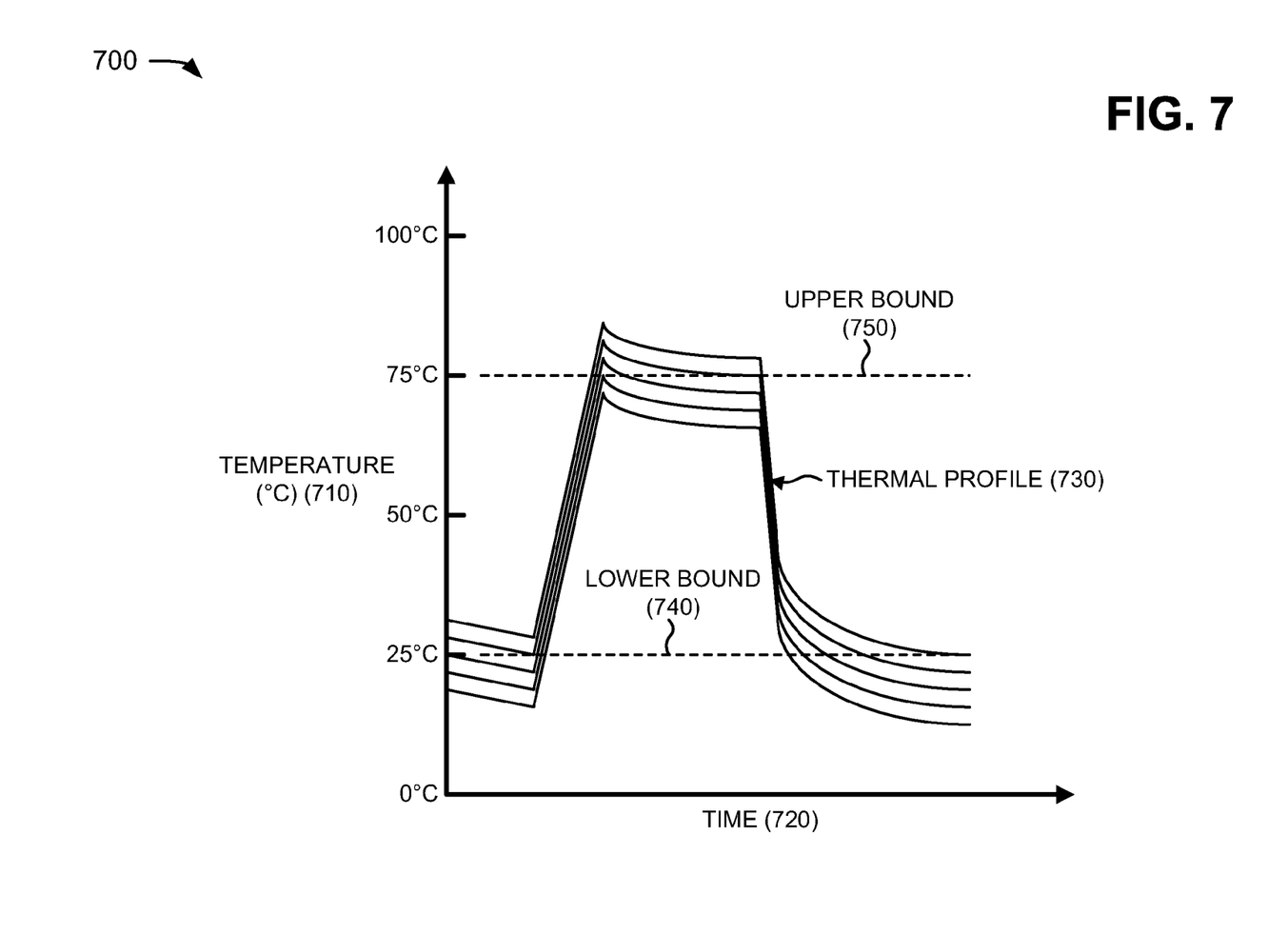
FIG. 7 is a graph of an example thermal profile capable of being generated by the power cycling test arrangement depicted in FIG. 1.

FIG. 7 is a graph 700 of an example thermal profile capable of being generated by power cycling test arrangement 100. In one embodiment, graph may correspond to power cycling thermal profile 340 (FIG. 3) generated by computing device 160 based on voltage feedback 320 and thermal feedback 330.

As shown in FIG. 7, graph 700 may include a temperature axis 710 (e.g., in degrees Celsius) and a time axis 720 (e.g., in seconds, minutes, etc.). Graph 700 may also include a thermal profile 730 of heat source 130. In one embodiment, thermal profile 730 may depict how temperatures of heat source 130 ramp up and down with thermal control (e.g., as provided by thermal resistors 610 and/or thermal diodes 620). As shown in FIG. 7, thermal profile 730 may begin at a lower temperature bound 740 (e.g., approximately 25° C.), may ramp up to an upper temperature bound 750 (e.g., approximately 75° C.), and may eventually ramp down to lower temperature bound 740.

Although FIG. 7 shows example elements of graph 700, in other embodiments, graph 700 may include fewer elements, different elements, differently arranged elements, or additional elements than depicted in FIG. 7.

Example Processes

Figure 8:
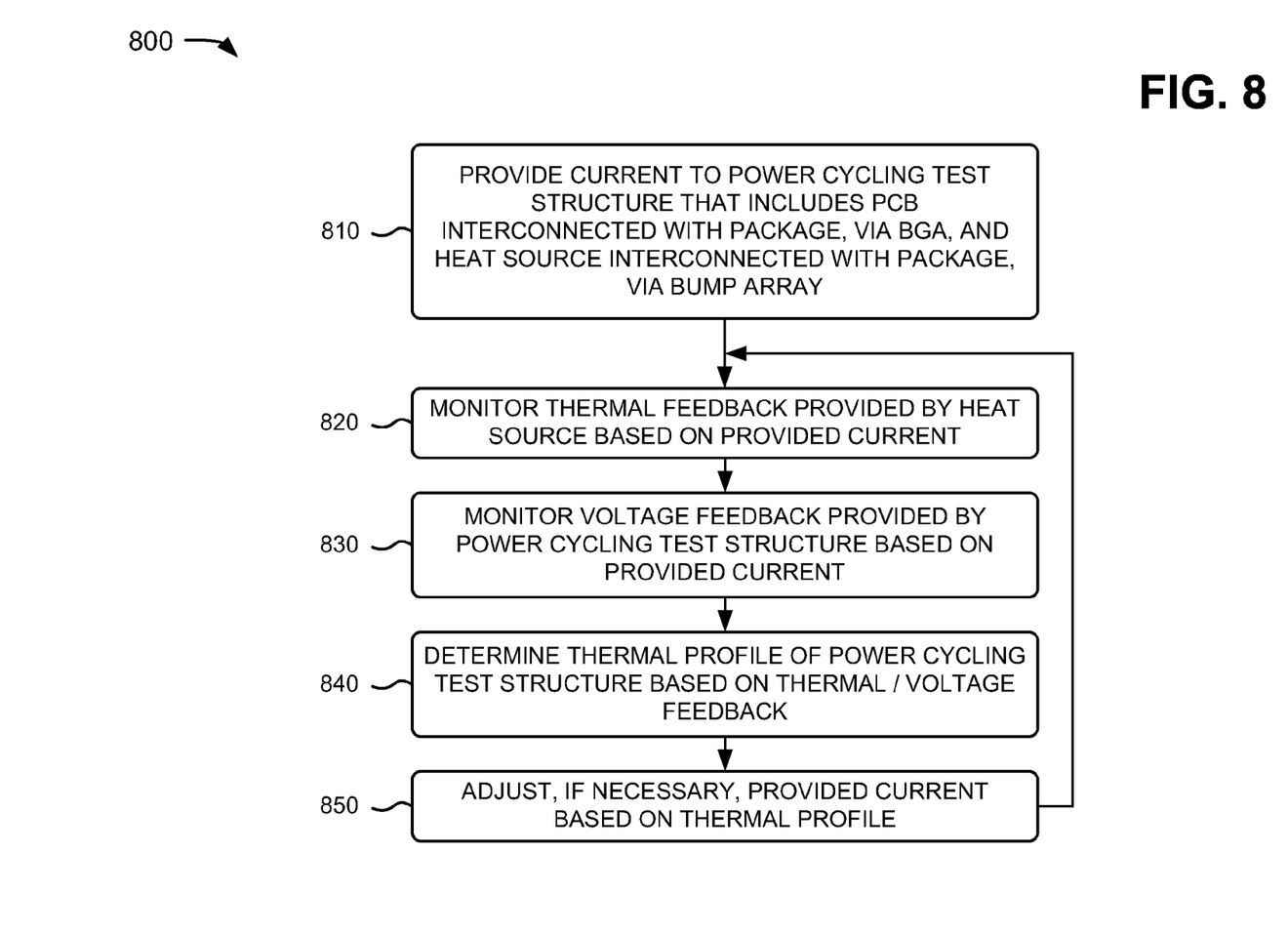
FIGS. 8 and 9 are flow charts of an example process for performing a power cycling test according to embodiments described herein.
Figure 9:
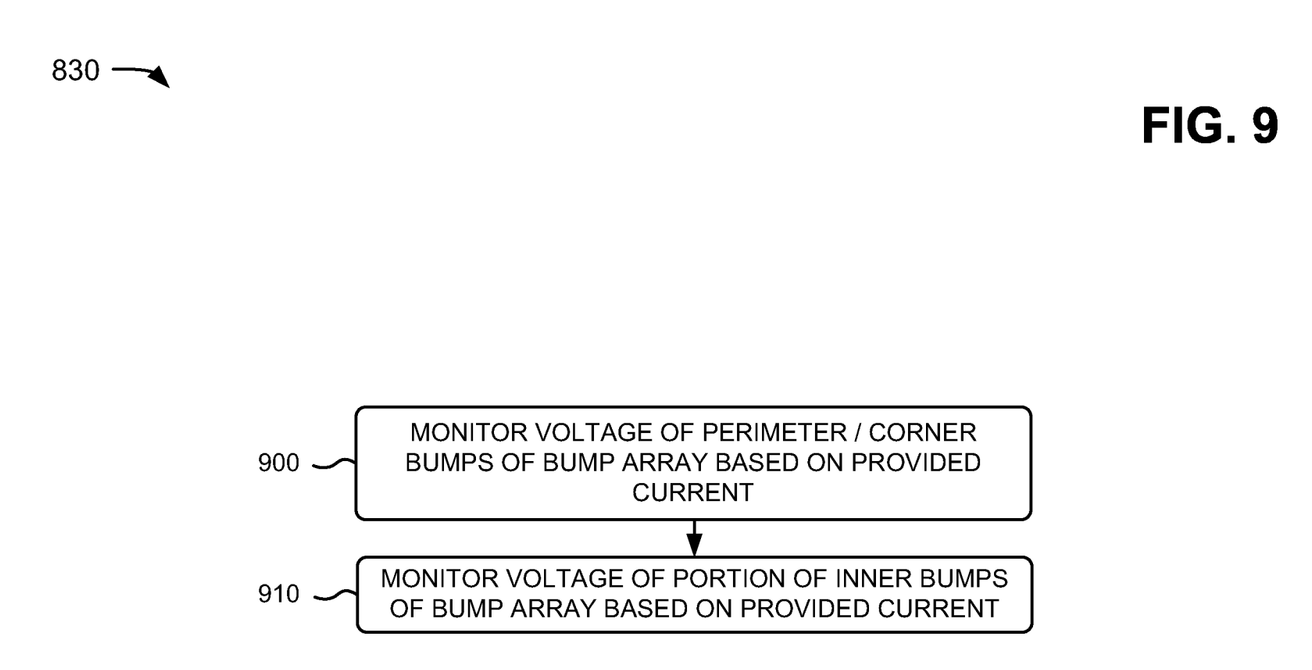

FIGS. 8 and 9 are flow charts of an example process 800 for performing a power cycling test according to embodiments described herein. In one embodiment, process 800 may be performed by computing device 160. In another embodiment, some or all of process 800 may be performed by one or more components of arrangement 100, including computing device 160.

As illustrated in FIG. 8, process 800 may include providing current to a power cycling test structure that includes a PCB interconnected with a package, via a BGA, and a heat source interconnected with the package, via a bump array (block 810). For example, in embodiments described above in connection with FIG. 1, power supply 150 may supply electrical energy (e.g., current) to PCB 110 via connector 105. PCB 110 may interconnect with package 120 via a second level interconnect mechanism (e.g., BGA 115), and package 120 may interconnect with heat source 130 via a first level interconnect mechanism (e.g., bump array 125). In one example, power supply 150 may provide current to connector 105, and the current may be provided to heat source 130 (e.g., via PCB 110, BGA 115, package 120, and bump array 125).

As further shown in FIG. 8, process 800 may include monitoring thermal feedback provided by the heat source based on the provided current (block 820), and monitoring voltage feedback provided by the power cycling test structure based on the provided current (block 830). For example, in embodiments described above in connection with FIG. 3, voltage monitor 155 may receive current 315 from connector 105, and may compare current 310 to current 315 in order to calculate voltage feedback 320. Voltage feedback 320 may include an output voltage associated with power supply 150. Voltage monitor 155 may provide voltage feedback 320 to computing device 160. Heat source 130 may provide thermal feedback 330 to thermal control 145. Thermal feedback 330 may include an amount of thermal energy (e.g., heat) generated by heat source 130 based on the supplied current 310. Thermal control 145 may provide thermal feedback 330 to computing device 160. Computing device 160 may receive voltage feedback 320 and thermal feedback 330.

Returning to FIG. 8, process 800 may include determining a thermal profile of the power cycling test structure based on the thermal feedback and/or the voltage feedback (block 840), and adjusting, if necessary, the provided current based on the thermal profile (block 850). For example, in embodiments described above in connection with FIG. 3, computing device 160 may calculate power cycling thermal profile 340 based on voltage feedback 320 and/or thermal feedback 330. Power cycling thermal profile 340 may include a graph depicting a temperature profile of heat source 130 over time. Power cycling thermal profile 340 may provide a visual indication of thermal mechanical stress induced in arrangement 100 (e.g., in PCB 110, BGA 115, package 120, and/or bump array 125). If power cycling thermal profile 340 needs to be adjusted, computing device 160 may provide a power signal 350 to power supply 150. Power signal 350 may indicate that an adjustment is needed for current 310 supplied by power supply 150. Power supply 150 may adjust current 310 according to power signal 350. Alternatively, or additionally, computing device 160 may provide a thermal control signal 360 to thermal control 145. Thermal control signal 360 may indicate that an adjustment is needed for the thermal energy provided by heat source 130. Based on thermal control signal 360, thermal control 145 may instruct (e.g., via a fan signal 370) fan 140 to either increase its speed (e.g., to provide more cooling) or to decrease its speed (e.g., to provide less cooling).

Process block 830 may include the process blocks depicted in FIG. 9. As shown in FIG. 9, process block 830 may include monitoring a voltage associated with perimeter and corner bumps of the bump array based on the provided current (block 900), and monitoring a voltage associated with a portion of inner bumps of the bump array based on the provided current (block 910). For example, in embodiments described above in connection with FIG. 5, voltages associated with perimeter/corner bumps 520 of bump array 125 may be fully monitored by arrangement 100, and voltages associated with a portion of inner bumps 530 of bump array 125 may be monitored by arrangement 100 since inner bumps 630 may not be prone to failures.

Figure 10:
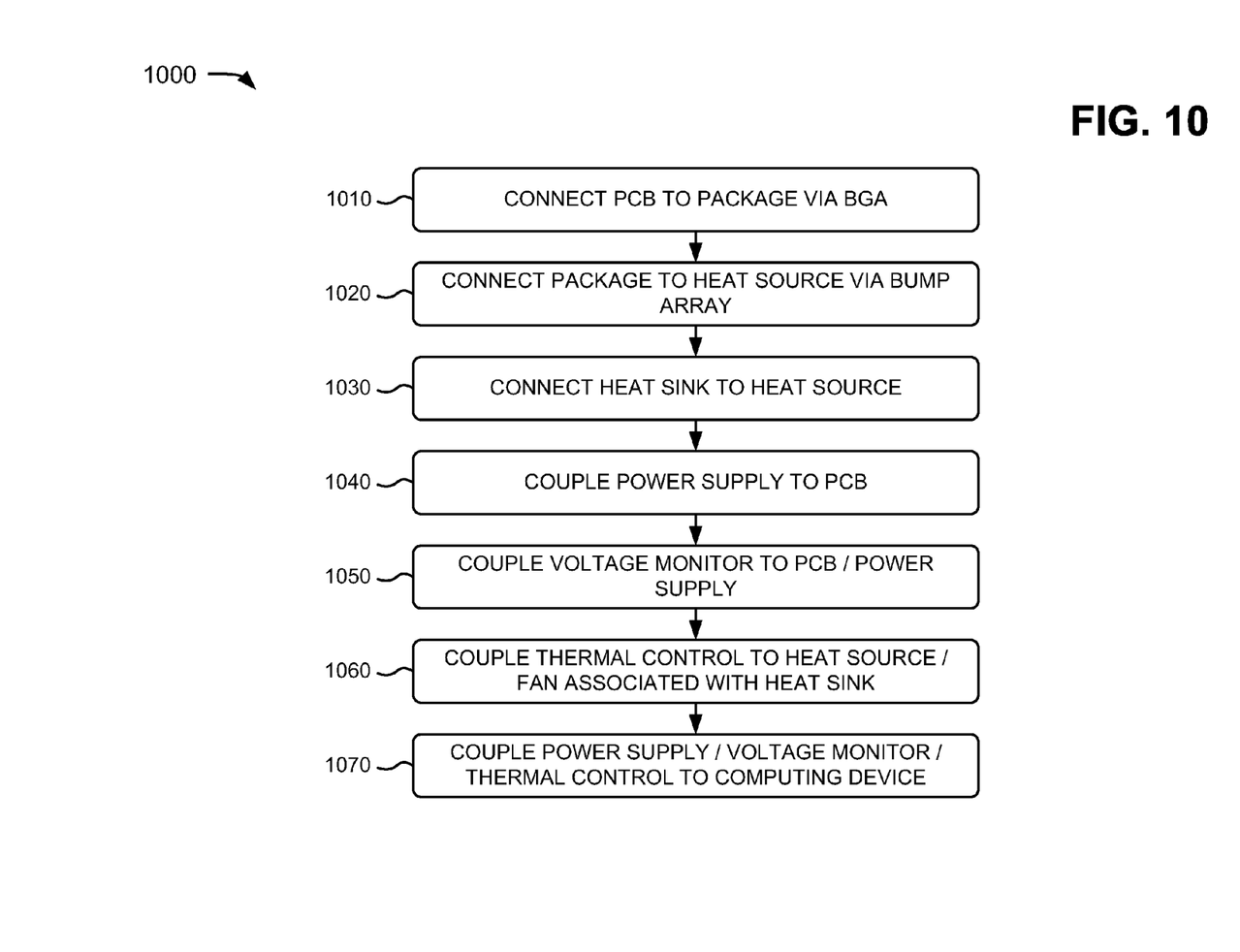
FIG. 10 is a flow chart of an example process for assembling the power cycling test arrangement according to embodiments described herein.

FIG. 10 is a flow chart of an example process 1000 for assembling power cycling test arrangement 100 according to embodiments described herein. As illustrated in FIG. 10, process 1000 may include connecting a PCB to a package via a BGA (block 1010), connecting the package to a heat source via a bump array (block 1020), and connecting a heat sink to the heat source (block 1030). For example, in embodiments described above in connection with FIG. 1, BGA 115 may include a mechanism that interconnects the wiring of PCB 110 and the wiring of package 120, and mechanically couples PCB 110 and package 120. Bump array 125 may include a mechanism that interconnects the wiring of package 120 and the wiring of heating elements 132 of heat source 130, and mechanically couples package 120 and heat source 130. Heat sink 135 may contact (or connect with) heat source 130, and may include extended surfaces (or fins) to increase the surface area in contact with the cooling fluid (e.g., air). Heat sink 135 may enable heat source 130 to be passively cooled.

As further shown in FIG. 10, process 1000 may include coupling a power supply to the PCB (block 1040), coupling a voltage monitor to the PCB and to the power supply (block 1050), coupling a thermal control to the heat source and to a fan associated with the heat sink (block 1060), and coupling the power supply, the voltage monitor, and the thermal control to a computing device (block 1070). For example, in embodiments described above in connection with FIG. 1, power supply 150 may be coupled to PCB 110 (e.g., via connector 105). Voltage monitor 155 may be coupled to PCB 110 (e.g., via connector 105), and may be coupled to power supply 150 (e.g., via a wired or wireless connection). Thermal control 145 may be coupled to heat source 130 (e.g., via a wired connection), and may be coupled to fan 140 (e.g., via a wired or wireless connection). Computing device 160 may be coupled to thermal control 145, power supply 150, and voltage monitor 155 (e.g., via wired or wireless connections).

Systems and/or methods described herein may provide a reliable assessment of thermally-induced mechanical stress (e.g., caused by power cycling) in components (e.g., microprocessors, PCBs, sockets, chips, packages, dies) and/or interconnect mechanisms (e.g., solder bumps, BGAs, PGAs, etc.) of a device, such as a personal computer, a laptop computer, a tablet computer, a PDA, a smart phone, a mobile phone, and/or other types computation or communication devices. In one embodiment, the systems and/or methods may connect heating elements, through a silicon BEOL interconnect, to a first level interconnect mechanism (e.g., a bump array, C4 bumps, pillars, micro bumps, etc.). The systems and/or methods may connect a package to the heating elements via the first level interconnect mechanism, and may further connect the package to a PCB via a second level interconnect mechanism (e.g., a BGA, a PGA, pads, etc.). In one example, the systems and/or methods may daisy chain the heating elements and the package via the first level interconnect mechanism, and may daisy chain the PCB and the package via the second level interconnect.

The foregoing description of embodiments provides illustration and description, but is not intended to be exhaustive or to limit the invention to the precise form disclosed. Modifications and variations are possible in light of the above teachings or may be acquired from practice of the invention.

For example, while series of blocks have been described with regard to FIGS. 8-10, the order of the blocks may be modified in other embodiments. Further, non-dependent blocks may be performed in parallel. In another example, the number of different applications and threads, described herein, were provided for explanatory purposes only.

It will be apparent that aspects, as described above, may be implemented in many different forms of software, firmware, and hardware in the embodiments illustrated in the figures. The actual software code or specialized control hardware used to implement these aspects should not be construed as limiting. Thus, the operation and behavior of the aspects were described without reference to the specific software code—it being understood that software and control hardware could be designed to implement the aspects based on the description herein.

Even though particular combinations of features are recited in the claims and/or disclosed in the specification, these combinations are not intended to limit the invention. In fact, many of these features may be combined in ways not specifically recited in the claims and/or disclosed in the specification.

No element, block, or instruction used in the present application should be construed as critical or essential to the invention unless explicitly described as such. Also, as used herein, the article "a" is intended to include one or more items. Where only one item is intended, the term "one" or similar language is used. Further, the phrase "based on" is intended to mean "based, at least in part, on" unless explicitly stated otherwise.

What is claimed is:

1. A computing device-implemented method, comprising:
providing, via the computing device, a current to a power cycling test structure that includes a heat source interconnected with a package via a first level interconnect mechanism, and a printed circuit board (PCB) interconnected with the package via a second level interconnect mechanism;
monitoring, by the computing device, thermal feedback associated with the heat source;
monitoring, by the computing device, voltage feedback associated with the power cycling test structure; and
determining, by the computing device, a thermal profile of the power cycling test structure based on the thermal feedback and the voltage feedback.

2. The computing device-implemented method of claim 1, further comprising:
adjusting the provided current based on the determined thermal profile.

3. The computing device-implemented method of claim 1, further comprising:
determining, based on the thermal profile, thermal mechanical stress associated with the power cycling test structure.

4. The computing device-implemented method of claim 1, where:
the first level interconnect mechanism includes a bump array; and
the second level interconnect mechanism includes a ball grid array (BGA).

5. The computing device-implemented method of claim 4, where monitoring voltage feedback comprises:
monitoring, based on the provided current, a voltage associated with perimeter and corner bumps of the bump array; and
monitoring, based on the provided current, a voltage associated with a portion of inner bumps of the bump array.

6. The computing device-implemented method of claim 1, where the thermal feedback and the voltage feedback are monitored based on the provided current.

7. The computing device-implemented method of claim 1, further comprising:
detecting a failure in the power cycling test structure based on the thermal profile; and utilizing time domain reflectometry (TDR) to determine whether the first level interconnect mechanism or the second level interconnect mechanism has failed.

8. A power cycling test system, comprising:
a power cycling test structure that includes:
   a heat source to provide thermal energy to the power cycling test structure,
   a package interconnected with the heat source, via a first level interconnect mechanism, and
   a printed circuit board (PCB) interconnected with the package, via a second level interconnect mechanism;
a power supply to provide current to the power cycling test structure; and
a computing device to:
   determine a thermal profile of the power cycling test structure based on a thermal feedback and a voltage feedback, where the thermal feedback is associated with the heat source and is based on the provided current, and the voltage feedback is associated with the power cycling test structure and is based on the provided current.

9. The power cycling test system of claim 8, further comprising:
a thermal control to monitor the thermal feedback and to provide the thermal feedback to the computing device; and
voltage monitor to monitor the voltage feedback and to provide the voltage feedback to the computing device.

10. The power cycling test system of claim 9, where the thermal control is further to:
control thermal energy generated by the heat source via a fan, associated with the heat source.

11. The power cycling test system of claim 10, where
the power supply is electrically coupled to the PCB,
the voltage monitor is electrically coupled to the PCB and the power supply,
the thermal control is electrically coupled to the heat source and the fan, and
the computing device is electrically coupled to the power supply, the voltage monitor, and the thermal control.

12. The power cycling test system of claim 8, where the computing device is further to:
adjust, based on the determined thermal profile, the current provided by the power supply.

13. The power cycling test system of claim 8, where the computing device is further to:
determine, based on the thermal profile, thermal mechanical stress associated with the power cycling test structure.

14. The power cycling test system of claim 8, where:
the first level interconnect mechanism includes a bump array, and
the second level interconnect mechanism includes a ball grid array (BGA).

15. The power cycling test system of claim 14, where the computing device is further to:
receive, based on the provided current, a voltage associated with perimeter and corner bumps of the bump array, and
receive, based on the provided current, a voltage associated with a portion of inner bumps of the bump array.

16. The power cycling test system of claim 8, where the computing device is further to:
detect a failure in the power cycling test structure based on the thermal profile, and
utilize time domain reflectometry (TDR) to determine whether the first level interconnect mechanism or the second level interconnect mechanism has failed.

17. The power cycling test system of claim 8, where the heat source includes:
a plurality of heating elements to provide thermal energy based on the provided current, and
a plurality of thermal resistors to measure the thermal energy provided by the heating elements and to provide the measured thermal energy, as the thermal feedback, to the computing device.

18. The power cycling test system of claim 17, where the heat source further includes:
a plurality of thermal diodes to measure the thermal energy provided by the heating elements and to provide the measured thermal energy, as the thermal feedback, to the computing device.

19. A device comprising:
a memory to store a plurality of instructions; and
a processor to execute instructions in the memory to:
   instruct a power supply to provide a current to a power cycling test structure that includes a heat source interconnected with a package, via a first level interconnect mechanism, and a printed circuit board (PCB) interconnected with the package, via a second level interconnect mechanism,
   monitor thermal feedback associated with the heat source,
   monitor, based on the provided current, voltage feedback associated with the power cycling test structure, and
   determine a thermal profile of the power cycling test structure based on the thermal feedback and the voltage feedback.

20. The device of claim 19, where the processor is further to execute instructions in the memory to:
adjust the provided current based on the determined thermal profile.

21. The device of claim 19, where the processor is further to execute instructions in the memory to:
determine, based on the thermal profile, thermal mechanical stress associated with the power cycling test structure.

22. The device of claim 19, where:
the first level interconnect mechanism includes a bump array; and
the second level interconnect mechanism includes one of a ball grid array (BGA), a pin grid array (PGA), or a land grid array (LGA).

23. The device of claim 22, where the processor is further to execute instructions in the memory to:
monitor, based on the provided current, a voltage associated with perimeter and corner bumps of the bump array, and
monitor, based on the provided current, a voltage associated with a portion of inner bumps of the bump array.

24. The device of claim 19, where the processor is further to execute instructions in the memory to:
detect a failure in the power cycling test structure based on the thermal profile, and
utilizing time domain reflectometry (TDR) to determine whether the first level interconnect mechanism or the second level interconnect mechanism has failed.

25. A computer-readable memory device that stores one or more computer-executable instructions, the computer-readable memory device comprising:
one or more instructions to instruct a power supply to provide a current to a power cycling test structure that includes a heat source interconnected with a package, via a first level interconnect mechanism, and a printed circuit board (PCB) interconnected with the package, via a second level interconnect mechanism;

one or more instructions to receive thermal feedback associated with the heat source;

one or more instructions to receive, based on the provided current, voltage feedback associated with the power cycling test structure;

one or more instructions to determine a thermal profile of the power cycling test structure based on the thermal feedback and the voltage feedback; and one or more instructions to adjust the provided current when the determined thermal profile indicates that the current should be adjusted.

* * * * *